United States Patent [19]
Kawata et al.

[11] Patent Number: 5,319,601
[45] Date of Patent: Jun. 7, 1994

[54] POWER SUPPLY START UP CIRCUIT FOR DYNAMIC RANDOM ACCESS MEMORY

[75] Inventors: Koji Kawata; Tadahiko Sugibayashi; Takahiro Hara, all of Tokyo, Japan

[73] Assignee: NEC Corporation, Japan

[21] Appl. No.: 958,301

[22] Filed: Oct. 8, 1992

[30] Foreign Application Priority Data

Oct. 25, 1991 [JP] Japan .................................. 3-279387

[51] Int. Cl.$^5$ ........................ G11C 13/00; H03K 3/01
[52] U.S. Cl. ..................................... 365/226; 365/227; 307/296.6
[58] Field of Search .................. 365/226, 227; 307/45, 307/272.3, 296.6

[56] References Cited

U.S. PATENT DOCUMENTS

| | | | |
|---|---|---|---|
| 4,930,112 | 5/1990 | Tanaka et al. | 365/226 |
| 5,063,304 | 11/1991 | Iyengar | 307/296.6 |
| 5,086,238 | 2/1992 | Watanabe | 307/296.6 |
| 5,087,850 | 2/1992 | Cave et al. | 307/296.6 |
| 5,197,033 | 3/1993 | Watanabe | 365/226 |

Primary Examiner—Eugene R. LaRoche
Assistant Examiner—Son Dinh
Attorney, Agent, or Firm—Laff, Whitesel, Conte, Saret

[57] ABSTRACT

A power supply circuit for a DRAM has a power-on detection circuit which detects when an external power supply potential reaches a predetermined potential and produces first and second detection signals, and an internal power supply circuit which generates an internal power supply potential. The power supply circuit further has a first intermediate potential generating circuit which generates a first intermediate potential from the external power supply potential and supplies it to an intermediate potential supplying node and, when the first detection signal is produced and the first intermediate potential reaches a predetermined potential, stops the supply of the first intermediate potential to the intermediate potential supplying node and the intermediate potential generating function, and a second intermediate potential generating circuit which generates a second intermediate potential from the internal power supply potential and, when the second detection signal is produced, supplies the second intermediate potential to the supplying node. The first intermediate potential generating circuit has a larger driving capability than that of the second intermediate potential generating circuit. It is made possible to shorten the rising time of the intermediate potential after the power is switched-on and to reduce the overall current consumption.

11 Claims, 4 Drawing Sheets

POWER SUPPLY START UP CIRCUIT FOR DYNAMIC RANDOM ACCESS MEMORY

BACKGROUND OF THE INVENTION (1) Field of the Invention

The present invention relates to a power supply circuit for a dynamic random access memory (hereinafter referred to as a "dynamic RAM"), and more particularly to a power supply circuit for a dynamic RAM having an internal power supply circuit for generating an internal power supply potential lower than an external power supply potential and a circuit for generating an intermediate potential which is one half of the internal power supply potential.

(2) Description of the Related Art

In the actual use of the dynamic RAMs, with the advancement of a higher integration thereof, the potential of an opposing electrode of a capacitor constituting a memory cell is set to an intermediate potential between a power supply potential and a ground potential from such a stand point as increasing reliability. In a dynamic RAM of 16 M-bits, it has reached to a point where one having an internal power supply circuit to generate a power supply potential lower than an external power supply potential is available. In that arrangement, the external power supply potential is generally 5 V but the internal power supply potential is used after it is lowered to 3.3 V. In this connection, the intermediate potential is set to 1.65 V which is an intermediate value between the internal power supply potential of 3.3 V and the ground potential.

FIG. 1 shows in a block diagram a conventional power supply circuit for a dynamic RAM, which has an internal power supply circuit and an intermediate potential generating circuit as described above.

The internal power supply circuit 2 receives an external power supply potential of 5 V and generally produces an internal power supply potential $V_{INT}$ of 3.3 V. The intermediate potential generating circuit 4a receives the internal power supply potential $V_{INT}$ and generates an intermediate potential $V_H$ which is one half the internal supply potential $V_{INT}$.

The intermediate potential $V_H$ which is driven by the internal power supply potential $V_{INT}$ is stable and not influenced by any fluctuations of the external power supply potential $V_{CC}$, which results in an increase in an operation margin or tolerance of the circuit to which the intermediate potential $V_H$ is supplied. However, when the power supply is switched on, there inevitably occurs a delay in the rise time of the internal power supply potential $V_{INT}$ because it rises in response to the external power supply potential. Further, since the intermediate potential generating circuit 4a has been designed to operate at a low potential and a low power consumption, the driving capability thereof is accordingly small so that it takes a time before the intermediate potential $V_H$ reaches a predetermined potential.

On the other hand, as for the rise time of the intermediate potential $V_H$, there is a requirement for this to be usable within 100 μS after the rising of the external power supply potential $V_{CC}$. In order to meet such requirement, it is necessary to make the intermediate potential generating circuit 4a sufficiently large for maintaining the corresponding driving capability.

In the conventional power supply circuit for the dynamic RAM described above, the internal power supply potential is received and then the intermediate potential $V_H$ is generated so that, after the power is switched on, it takes a time for the intermediate potential $V_H$ to reach a predetermined potential. Any attempt to make such time shorter will inevitably result in an increase in current consumption. These are problems to be solved by this invention, in the conventional power supply circuit for the dynamic RAM.

SUMMARY OF THE INVENTION

It is, therefore, an object of the invention to overcome the problems existing in the conventional power supply circuit for a dynamic RAM, and to provide an improved power supply circuit for a dynamic RAM in which the rise time of the intermediate potential is made short after the power is switched on and the current consumption involved is made small.

According to one aspect of the invention, there is provided a power supply circuit for a dynamic RAM comprising:

a power-on detection circuit which detects when an external power supply potential externally supplied reaches a predetermined potential after power is switched on, and produces a first and a second detection signal;

an internal power supply circuit which receives the external power supply potential and generates an internal power supply potential of a potential lower than the external power supply potential;

a first intermediate potential generating circuit which receives the external power supply potential, generates a first intermediate potential and supplies it to an intermediate potential supplying node and, when the first detection signal is present and the first intermediate potential reaches a predetermined potential, stops the supply of the first intermediate potential to the intermediate potential supplying node and stop the operation the intermediate potential generating circuit, the first intermediate potential generating circuit having a predetermined intermediate-potential driving capability for the intermediate potential supplying node; and a second intermediate potential generating circuit which receives the internal power supply potential and generates a second intermediate potential and, when the second detection signal is present, supplies the second intermediate potential to the intermediate potential supplying node, the second intermediate potential generating circuit having an intermediate-potential driving capability smaller than that of the first intermediate potential generating circuit.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, embodiments of the present invention will be explained with reference to the accompanying drawings.

Figure 1:
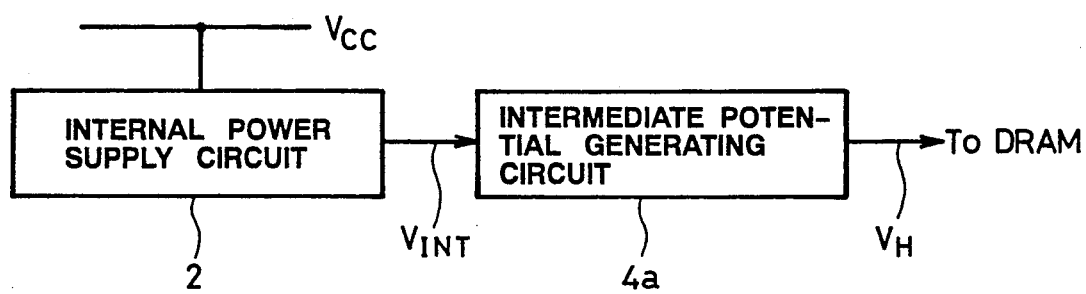
FIG. 1 is a block diagram showing an example of a conventional power supply circuit for a dynamic RAM.
Figure 2:
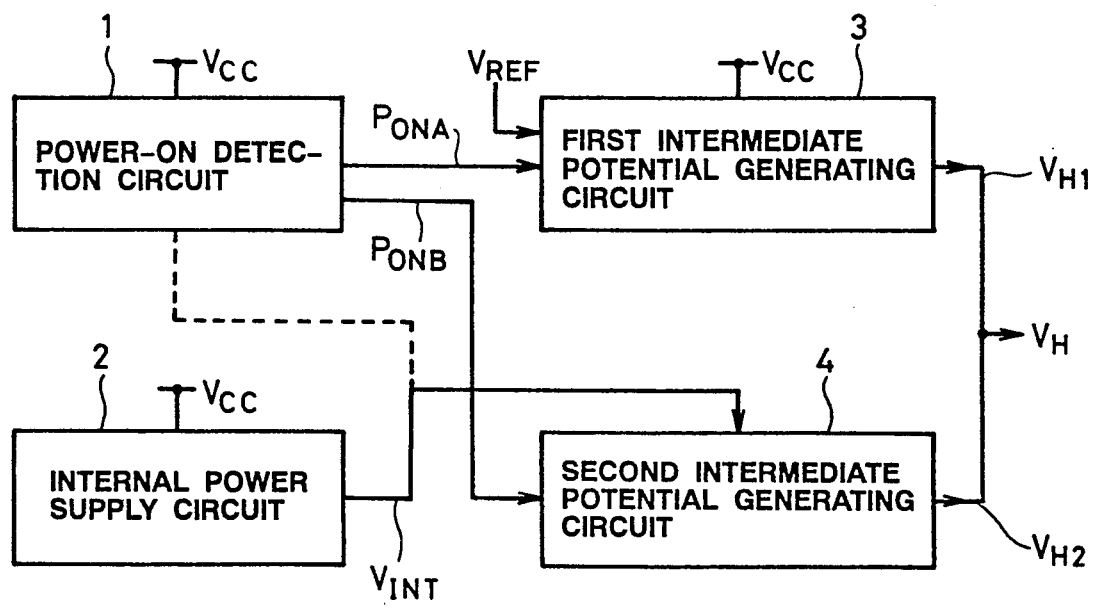
FIG. 2 is a block diagram showing a power supply circuit for a dynamic RAM of an embodiment according to the invention.

FIG. 2 shows in a block diagram an embodiment of a power supply circuit for a dynamic RAM according to the invention.

The power supply circuit for dynamic RAM of the invention is constituted by a power-on detection circuit 1, an internal power supply circuit 2, a first intermediate potential generating circuit 3, and a second intermediate potential generating circuit 4. The power-on detection circuit 1 detects whne the external power supply potential $V_{CC}$ reaches a predetermined potential after the external power supply circuit is switched on and produces detection signals $P_{ONA}$ and $P_{ONB}$. The internal power supply circuit 2 receives the external power supply potential $V_{CC}$ and generates the internal power supply potential $V_{INT}$ of a potential lower than the external power supply potential $V_{CC}$. The first intermediate potential generating circuit 3 having a large driving capability for the intermediate potential receives the external power supply potential $V_{CC}$ and the reference voltage $V_{REF}$, generates the first intermediate potential $V_{H1}$ and supplies it to an intermediate potential supplying node and, when the detection signal $P_{ONA}$ is produced and the first intermediate potential $V_{H1}$ reaches a predetermined potential, stops supplying the first intermediate potential $V_{H1}$ to the intermediate potential supplying node and also stops its function of generating the first intermediate potential $V_{H1}$. The second intermediate potential generating circuit 4 receives the internal power supply potential $V_{INT}$ and generates the second intermediate potential $V_{H2}$ and, when the detection signal $P_{ONB}$ is generated, supplies the second intermediate potential $V_{H2}$ to the intermediate potential supplying node with a driving capability for the intermediate potential smaller than that of the first intermediate potential generating circuit 3.

Figure 3:
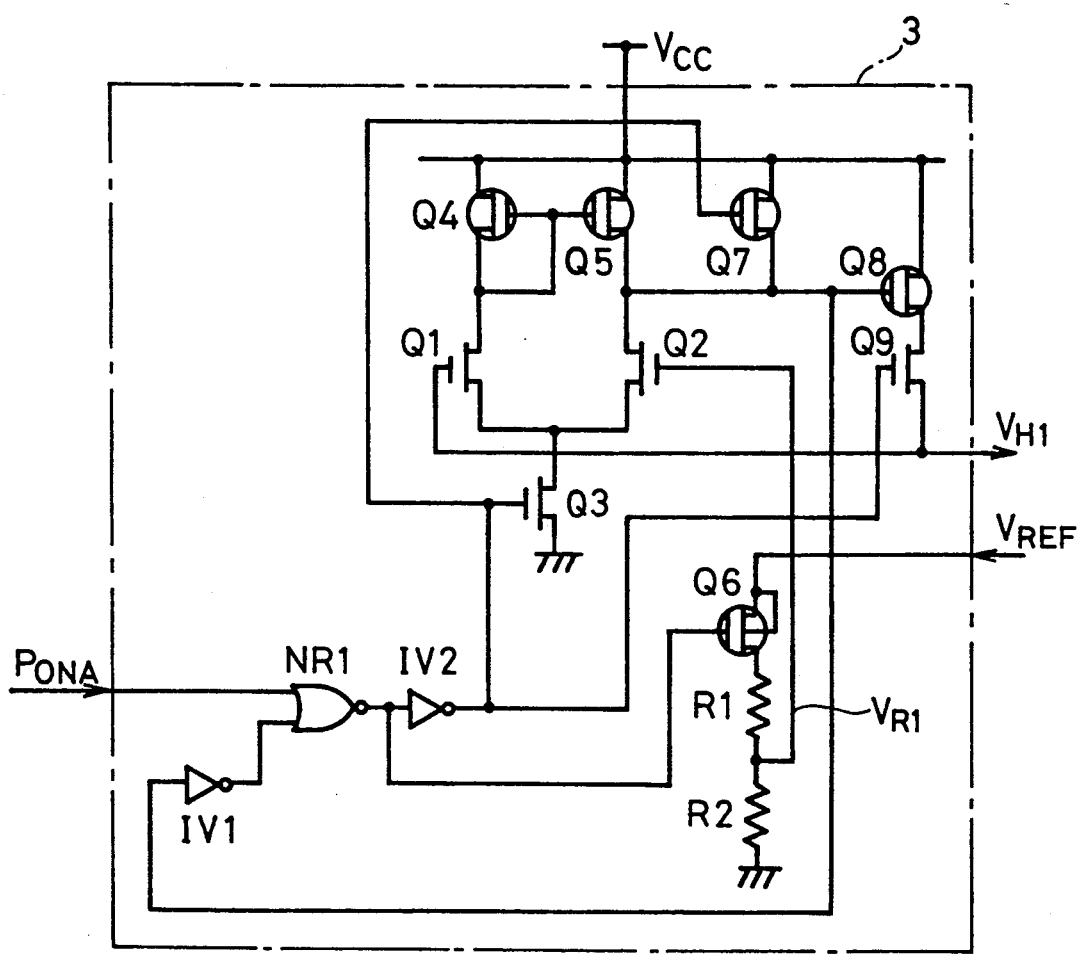
FIG. 3 is a detailed circuit diagram showing a first intermediate potential generating circuit shown by the block in FIG. 2.
Figure 4:
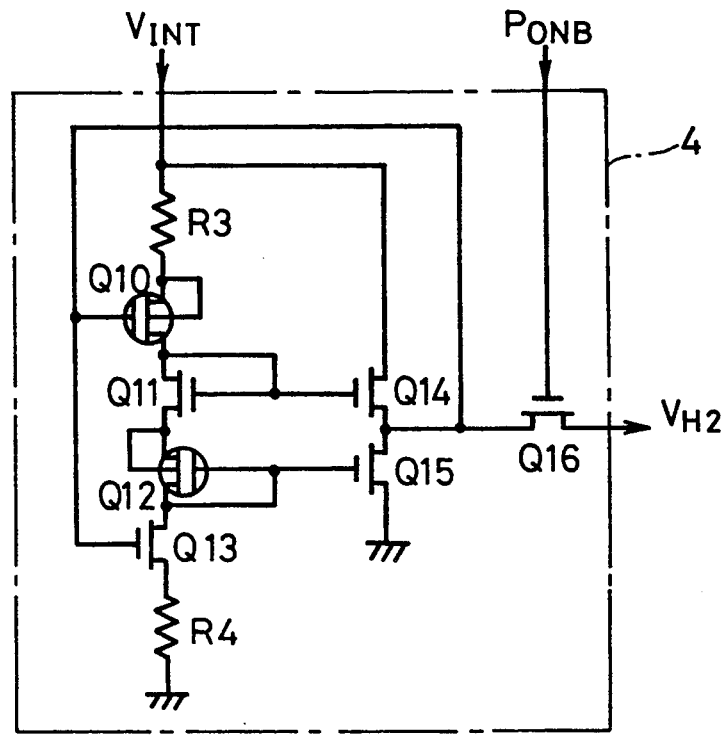
FIG. 4 is a circuit diagram showing a second intermediate potential generating circuit shown by the block in FIG. 2.

Next, detailed circuit diagrams of the first and second intermediate potential generating circuits 3 and 4 are explained with reference to FIGS. 3 and 4.

The first intermediate potential generating circuit 3 comprises a differential amplifier circuit which includes a first transistor Q1 having a gate connected to the intermediate potential supplying node; a second transistor Q2 having a gate receiving an internal reference voltage $V_{RI}$ and a source connected to a source of the first transistor Q1; transistors Q4 and Q5 of a load circuit of a current-mirror configuration connected between drains of the first and second transistors Q1, Q2 and a node to which the external power supply potential $V_{CC}$ is supplied; and a transistor Q3 for controlling the activation. The differential amplifier circuit outputs the first intermediate potential from the drain of the second transistor Q2. The first intermediate potential generating circuit 3 further comprises a transistor Q6 and resistors R1, R2 for generating the internal reference voltage $V_{RI}$ from the reference voltage $V_{REF}$, a NOR gate NR1, inverters IV1, IV2, and transistors Q7~Q9 for controlling the supplying and stopping of the intermediate potential $V_{H1}$ to the intermediate potential supplying node based on the detection signal $P_{ONA}$ and the potential at the drain of the transistor Q2. The reference voltage $V_{REF}$ externally supplied to the first intermediate potential generating circuit 3 is produced from the external power supply potential $V_{CC}$.

The second intermediate potential generating circuit 4 comprises a resistor 3 receiving at its one end the internal power supply potential $V_{INT}$, a resistor 4 having one end grounded; a transistor Q10 having a source connected to the other end of the resistor R3 and a gate receiving the second intermediate potential; a transistor Q13 having a source connected to the other end of the resistor R4 and a gate receiving the second intermediate potential; a transistor Q11 having a gate and a drain commonly connected to a drain of the transistor Q10; a transistor Q12 having a gate and a drain commonly connected to a drain of the transistor Q13 and a source connected to a source of the transistor Q11; a transistor Q14 having a drain receiving the internal power supply potential $V_{INT}$, a gate connected to the gate of the transistor Q11 and a source outputting the second intermediate potential; a transistor Q15 having a source grounded, a gate connected to the gate of the transistor Q12 and a drain connected to the source of the transistor Q14; and a transistor Q16 having a gate receiving the detection signal $P_{ONB}$ and being for controlling the supplying and stopping of the second intermediate potential $V_{H2}$ to the intermediate potential supplying node.

Figure 5:
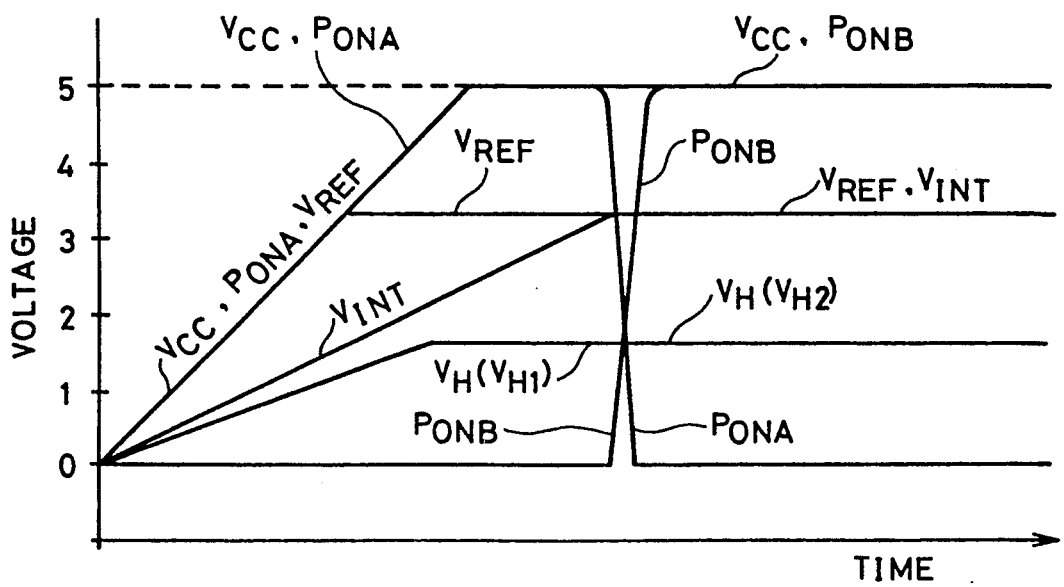
FIG. 5 is graph showing a waveform of each of the related signals for use in the explanation of the operation of the arrangement as shown in FIG. 2.

Now, the operation of the circuit according to this embodiment is explained. FIG. 5 shows waveforms of various signals for the explanation of the operation of the circuit of this embodiment.

The power-on detection circuit 1 detects when the external power supply potential $V_{CC}$ reaches 5 V and produces the detection signal $P_{ONA}$ whose potential changes from the external power supply potential $V_{CC}$ to the ground potential and the detection signal $P_{ONB}$ whose potential changes from the ground potential to the external power supply potential $V_{CC}$.

During the period in which the detection signal $P_{ONA}$ rises in accordance with the external power supply potential $V_{CC}$ level and it is settled to 5 V of the external power supply potential $V_{CC}$ after the power supply is switched-on, the transistors Q3, Q9 are ON and the transistor Q7 is OFF so that the differential amplifier circuit constituted by the transistors Q1~Q5 operates and the first intermediate potential $V_{H1}$ is supplied to the intermediate potential supplying node through the transistors Q8 and Q9.

The first intermediate potential $V_{H1}$ has a large driving capability and there is little delay with respect to the rising of the external power supply potential $V_{CC}$ because the intermediate potential supplying node is driven by the differential amplifier circuit and the transistor Q8, and the first intermediate potential is produced from the external power supply potential $V_{CC}$. Thus, the rising of the intermediate potential $V_{H1}$ at the intermediate potential supplying node is fast.

By the time when the detection signal $P_{ONA}$ becomes the ground potential and, at the same time, the detection signal $P_{ONB}$ becomes the external power supply potential $V_{CC}$, not only the first intermediate potential $V_{H1}$ but also the second intermediate potential $V_H$ has reached a predetermined level (1.65 V).

Therefore, the transistors Q3, Q9 are turned OFF and the transistor Q7 is turned ON so that the supply of the intermediate potential $V_{H1}$ from the first intermediate potential generating circuit 3 to the intermediate potential supplying node stops and the intermediate potential generating function for the $V_{H1}$ also stops. At the same time, the transistor Q16 turns ON and, in place of the first intermediate potential $V_{H1}$, the second intermediate potential $V_{H2}$ is supplied from the second intermediate potential generating circuit 4 to the intermediate potential supplying node. Since the second intermediate potential generating circuit 4 is of a resistor-divided type, current consumed therein is small.

In the manner as explained above, the first intermediate potential generating circuit 3 which has a large driving capability supplies the first intermediate potential $V_{H1}$ by means of the first intermediate potential generating circuit 3 until the external power supply potential $V_{CC}$ reaches and is settled at a predetermined voltage of 5 V and this results in a fast rising of the intermediate potential at the intermediate potential supplying node. After the external power supply potential $V_{CC}$ has been settled and the second intermediate potential $V_{H2}$ reaches a predetermined potential, the intermediate potential generating function of the first intermediate potential generating circuit 3 stops and the second intermediate potential $V_{H2}$ is supplied from the second intermediate potential generating circuit 4 in which the current consumption is small, thereby reducing the overall current consumption in the circuit.

In this embodiment, the detection signals $P_{ONA}$, $P_{ONB}$ are produced by the detection of only the external power supply potential $V_{CC}$ but, of course, it is possible to provide an arrangement wherein the detection signals $P_{ONA}$, $P_{ONB}$ are produced by the detection of both the external power supply potential $V_{CC}$ and the internal power supply potential $V_{INT}$ having reached the predetermined potentials respectively set in advance. In this case, the internal power supply potential $V_{INT}$ is inputted to the power-on detection circuit 1 as shown by a dotted line in FIG. 2. This arrangement ensures a further stable switching from the first intermediate potential $V_{H1}$ to the second intermediate potential $V_{H2}$.

In a dynamic RAM, the node for being supplied with the intermediate potential may not be limited to one node as there may be a plurality of nodes such as for opposing electrodes of memory capacitor elements and pre-charge circuits. In such a case, since a plurality of intermediate potentials may vary, that is, low or high, to some extent from one to another, there may be provided a plurality of such first and second intermediate generating circuits as described above (as shown in FIG. 6) thereby to supply the appropriate intermediate potentials to the respective circuits separately.

Figure 6:
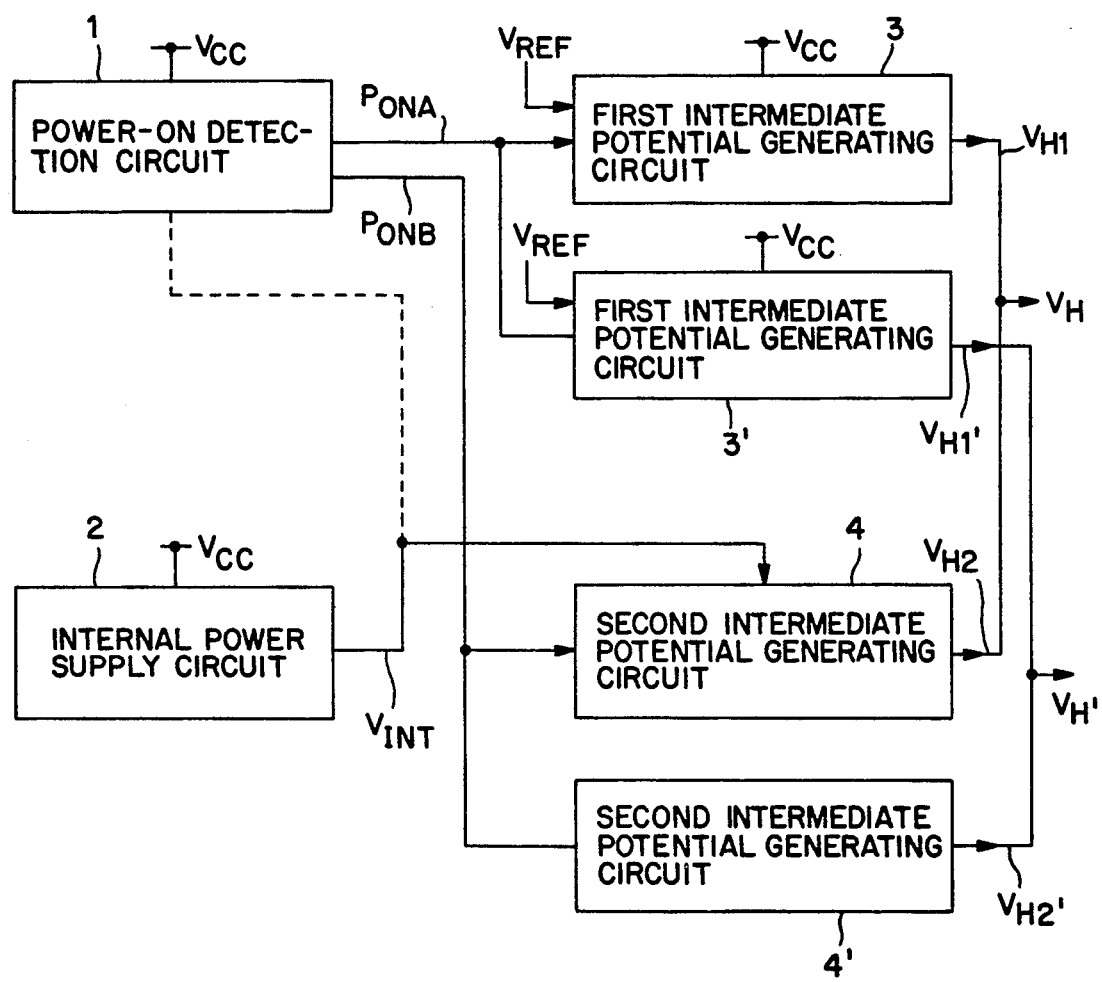
FIG. 6 is a block diagram showing a power supply circuit for a dynamic RAM of another embodiment according to the invention.

In FIG. 6, in addition to the first and second intermediate potential generating circuits 3 and 4 (FIG. 2), there are a first intermediate potential generating circuit 3' for generating the first intermediate potential $V_{H1}$ and a second intermediate potential generating circuit 4' for generating the second intermediate potential $V_{H2}'$. The intermediate potential $V_H$, based on the first and second intermediate potentials $V_{H1}$, and $V_{H2}$, is different from the intermediate potential $V_H'$ based on the first and second intermediate potentials $V_{H1}'$ and $V_{H2}'$.

As explained above, the arrangement according to the invention includes the power-on detection circuit which generates a detection signal upon the detection of the external power supply potential having reached a predetermined level and the first intermediate potential generating circuit which has a large driving capability and which generates an intermediate potential from the external power supply potential. From the time when the power is switched-on until the time when the detection signal is produced, the first intermediate potential generating circuit supplies the intermediate potential to a predetermined node and, after the generation of the detection signal, the second intermediate potential generating circuit which generates the second intermediate potential from the internal power supply potential supplies the intermediate potential to the above-mentioned node and also stops the intermediate potential generating function of the first intermediate potential generating circuit. With this arrangement, it is made possible to shorten the rising time of the intermediate potential at the above-mentioned node after the power is switched-on and to reduce the overall current consumption of the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A power supply circuit for a dynamic RAM comprising:

a power-on detection circuit which detects when an external power supply potential externally supplied reaches a predetermined potential after power is switched on, and produces a first and a second detection signal;

an internal power supply circuit which receives the external power supply potential and generates an internal power supply potential of a potential lower than said external power supply potential;

a first intermediate potential generating circuit which receives said external power supply potential, generates a first intermediate potential and supplies it to an intermediate potential supplying node and, when said first detection signal is present and said first intermediate potential reaches a predetermined potential, stops the supply of said first intermediate potential to said intermediate potential supplying node and stops the operation of the first intermediate potential generating circuit, said first intermediate potential generating circuit having a predetermined intermediate-potential driving capability for said intermediate potential supplying node; and a second intermediate potential generating circuit which receives said internal power supply potential and generates a second intermediate potential and, when said second detection signal is present, supplies said second intermediate potential to said intermediate potential supplying node, said second intermediate potential generating circuit having an intermediate-potential driving capability smaller than that of said first intermediate potential generating circuit.

2. A power supply circuit for a dynamic RAM according to claim 1, wherein said first intermediate potential generating circuit comprises a differential amplifier circuit formed by a first transistor having a gate connected to said intermediate potential supplying node; a second transistor having a gate receiving a reference voltage and a source connected to a source of said first transistor; a third transistor having a drain connected to the common sources of said first and second transistors, and a source grounded; a fourth transistor having a gate and a drain connected to a drain of said first transistor, and a source connected to a node to which said external power supply potential is inputted; and a fifth transistor having a gate connected to the gate of said fourth transistor, a drain connected to a drain of said second transistor, and a source connected to the node to which said external power supply potential is inputted, said fifth transistor together with said fourth transistor forming a current-mirror type load circuit for said first and second transistors, and said first intermediate potential being outputted from a common connection node of said second and fifth transistors.

3. A power supply circuit for a dynamic RAM according to claim 2, wherein said first to third transistors are N-channel MOS transistors, and said fourth and fifth transistors are P-channel MOS transistors.

4. A power supply circuit for a dynamic RAM according to claim 2, wherein said first intermediate potential generating circuit comprises a control circuit which control the supply of said first intermediate potential to said intermediate potential supplying node in accordance with said first detection signal from said power-on detection circuit.

5. A power supply circuit for a dynamic RAM according to claim 2, wherein said first intermediate potential generating circuit further comprises a reference voltage generating circuit which produces said reference voltage from said external power supply potential.

6. A power supply circuit for a dynamic RAM according to claim 1, wherein said power-on detection circuit also receives said internal power supply potential from said internal power supply circuit, and produces said second detection signal upon detecting when said internal power supply potential reaches a predetermined potential.

7. A power supply circuit for a dynamic RAM according to claim 1, wherein a plurality of said first intermediate potential generating circuits for generating a plurality of said first intermediate potentials different from one another and a plurality of said second intermediate potential generating circuit for generating a plurality of said second intermediate potentials different from one another are provided for the dynamic RAM.

8. A power supply circuit for a dynamic RAM according to claim 1, wherein said second intermediate potential generating circuit comprises a first resistor receiving at its one end said internal power supply potential; a second resistor having one end grounded; a first transistor having a source connected to the other end of said first resistor and a gate receiving said second intermediate potential; and a second transistor having a source connected to the other end of said second resistor and a gate receiving said second intermediate potential; a third transistor having a gate and a drain commonly connected to a drain of said first transistor; a fourth transistor having a source connected to a source of said third transistor, a gate and a drain commonly connected to a drain of said second transistor, a fifth transistor having a drain receiving said internal power supply potential, a gate connected to the gate of the third transistor; and a sixth transistor having a source grounded, a gate connected to the gate of said fourth transistor, a drain connected to a source of said fifth transistor, said second intermediate potential being outputted from a connection node between the source of said fifth transistor and the drain of said sixth transistor.

9. A power supply circuit for a dynamic RAM according to claim 8, wherein said first and fourth transistors are P-channel MOS transistors, and said second, third, fifth and sixth transistors are N-channel MOS transistors.

10. A power supply circuit for a dynamic RAM according to claim 8, wherein said second intermediate potential generating circuit further comprises a control circuit which controls the supply of said second intermediate potential to said intermediate potential supplying node in accordance with said second detection signal from said power-on detection circuit.

11. A power supply circuit for a dynamic RAM according to claim 10, wherein said control circuit includes an N-channel MOS transistor having a drain connected to the connection node between the source of said fifth transistor and the drain of said sixth transistor, a gate receiving said second detection signal, and a source connected to said intermediate potential supplying node.

* * * * *